United States Patent [19]

Suzuki

[11] Patent Number: 4,489,423
[45] Date of Patent: Dec. 18, 1984

[54] CHARGE TRANSFER TYPE AREA IMAGE SENSOR WITH IMPROVED RESOLUTION AND BLOOMING SUPPRESSION

[75] Inventor: Nobuo Suzuki, Kamakura, Japan

[73] Assignee: Tokyo Shibaura Denki Kabushiki Kaisha, Kawasaki, Japan

[21] Appl. No.: 283,192

[22] Filed: Jul. 14, 1981

[30] Foreign Application Priority Data

Nov. 4, 1980 [JP] Japan ................. 55-154826

[51] Int. Cl.³ ............... G11C 19/28; H01L 29/78; H01L 27/14; H01L 31/00
[52] U.S. Cl. ........................ 377/58; 357/24; 357/30; 377/62; 307/311
[58] Field of Search ........... 357/24 LR, 24 M, 30; 377/58, 61–63; 307/311

[56] References Cited

U.S. PATENT DOCUMENTS

| 3,931,465 | 1/1975 | Levine | 357/24 |
| 4,117,514 | 9/1978 | Terui et al. | 357/24 LR |
| 4,236,168 | 11/1980 | Herbst et al. | 357/24 |
| 4,245,164 | 1/1981 | Funahashi | 357/24 LR |

FOREIGN PATENT DOCUMENTS 2026769 2/1980 United Kingdom .

OTHER PUBLICATIONS

Ishirara et al., "CCD Image Sensor For Single Sensor Color Camera", IEEE Int. Solid-State Circuits Conf., (2/80), Dig. Tech. Papers, pp. 24–25.
Tseng et al., "Charge Transfer and Blooming Suppression of Charge Transfer Photodiode Area Array", IEEE Journal of Solid State Circuits, vol. SC-15, No. 2, Apr. 1980, New York.

*Primary Examiner*—Gene M. Munson
*Attorney, Agent, or Firm*—Finnegan, Henderson, Farabow, Garrett & Dunner

[57] ABSTRACT

A charge transfer type area image sensor comprises a plurality of photosensitive picture elements arranged on a semiconductor substrate in a plurality of columns and rows. Columnar groups of shift registers including a plurality of charge transfer electrodes are disposed adjacent to the respective columnar groups of photosensitive picture elements. Storage electrodes are provided between the columnar groups of shift registers and a row-directed shift register for sending forth output signals to temporarily store signal charges generated in the photosensitive picture elements. Signal charges generated in photosensitive picture elements and then transmitted to the corresponding columnar group of shift registers in response to a first selection signal are temporarily stored under the storage electrodes and then conducted to the row-directed shift register to be sent forth therefrom as series signal charges. Excess charges transmitted to the corresponding columnar groups of shift registers in response to a second selection signal are discharged to drains through control electrodes positioned adjacent to the last charge transfer electrodes of the respective columnar groups of shift registers, thereby assuring improvement in the integration density of photosensitive picture elements and the suppression of blooming.

2 Claims, 34 Drawing Figures

CORRESPONDING TO FIG. 2B
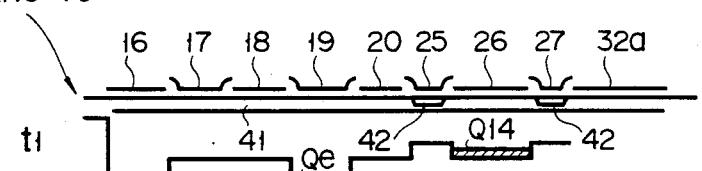
FIG. 4A  t1
FIG. 4B  t2
FIG. 4C  t3
FIG. 4D  t4
FIG. 4E  t5
FIG. 4F  t6
FIG. 4G  t7
FIG. 4H  t8
FIG. 4I  t9
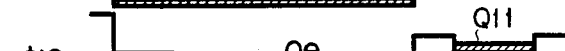
FIG. 4J  t10
FIG. 4K  t11
FIG. 4L  t12
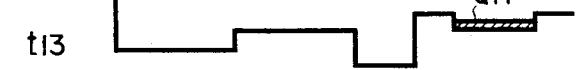
FIG. 4M  t13
FIG. 4N  t14
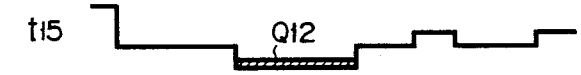
FIG. 4P  t15

FIG. 5A  t3 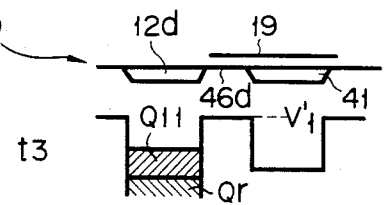
FIG. 5B  t4 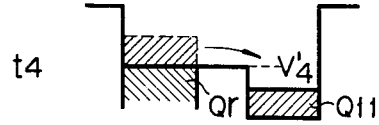
FIG. 5C  t5 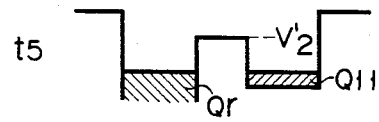
FIG. 5D  t1, t12 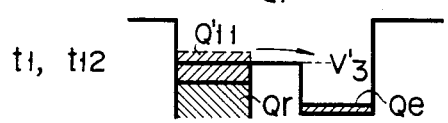
FIG. 5E  t15 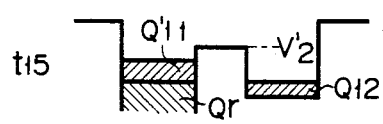
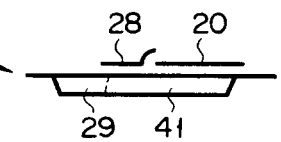
FIG. 6A  t2, t8~t14
FIG. 6B  t5
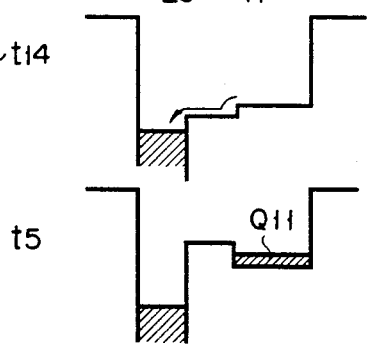

CHARGE TRANSFER TYPE AREA IMAGE SENSOR WITH IMPROVED RESOLUTION AND BLOOMING SUPPRESSION

BACKGROUND OF THE INVENTION

1. Field of the Invention

This invention relates to a charge transfer type area image sensor, and more particularly to a charge transfer type area image sensor which assures an increase in the integration density of picture elements and the function of suppressing blooming.

2. Description of the Prior Art

The charge transfer type area image sensor is used as an image device, for example, in an optical character recognition system (OCR) or television camera. Charge transfer type area image sensors known in the art include the frame transfer system and the interline system. Both systems have to be provided with means for eliminating an excess charge stored in picture elements in order to suppress blooming resulting from an intense incoming light. For better understanding of this invention, description is now given with reference to FIG. 1 of the conventional charge transfer type area image sensor of the interline system. Reference numeral 1 denotes a p-type semiconductor substrate. Reference numerals 2a to 2d, 3a to 3d, 4a to 4d and 5a to 5d respectively represent four photosensitive picture elements, for example, photodiodes arranged in the direction of a column. Reference numerals 6a to 6d show columnar shift registers respectively set adjacent to each columnar group of photosensitive picture elements. Reference numeral 7 denotes a row-directed shift register extending in a row direction intersecting at right angles the column direction in which the columnar shift registers 6a to 6d are arranged. Reference numerals 8a to 8d indicate overflow control electrodes which are positioned on the opposite side of the respective columnar groups of photosensitive picture elements to the columnar groups of shift registers 6a to 6d. Overflow drains 9a to 9d of n+ regions are provided on the left side of the respective overflow control electrodes 8a to 8d. Reference numeral 10 is a charge output terminal of the aforesaid shift register 7 extending in the row direction.

When the photosensitive picture elements 2a to 2d, 3a to 3d, 4a to 4d, 5a to 5d of the conventional area image sensor receive a light for a prescribed length of time, a signal charge is generated in each of the photosensitive picture elements in an amount corresponding to the luminosity of the light received. The signal charges are transferred to the corresponding shift registers 6a to 6d, and thereafter sent forth from the output terminal 10 through the row-extending shift register 7. Excess charges produced in the picture elements due to the projection of a light having a greater luminosity than prescribed run beyond potential barriers formed in those portions of the semiconductor substrate 1 which lie below the overflow control electrodes 8a to 8d set at a prescribed level of potential, and then flow into the overflow drains 9a to 9d. Therefore, excess charges generated in the picture elements are eliminated, thereby suppressing the occurrence of blooming.

However, the conventional area image sensor is accompanied with the following drawbacks. First, overflow control electrodes and overflow drains have to be provided for the respective columnar groups of photosensitive picture elements, limiting the ability to increase the integration density of photosensitive picture elements, and consequently presenting difficulties in improving the resolving power of displayed images. In the second place, excess charges generated in the picture elements are conducted to the corresponding overflow drains, thereby indeed suppressing the occurrence of blooming which might otherwise arise from such excess charges. But the prior art area image sensor is still accompanied with the difficulties that excess charges from other sources, that is, those produced in the semiconductor substrate 1 are partly diverted into the columnar groups of shift registers 6a to 6d. In such case, when an intense spot of light is received, then excess charges generated in the semiconductor substrate 1 leak to the shift registers 6a to 6d; and consequently vertically extending white lines appear on a displayed image. Those white lines are referred to as a smear phenomenon (a kind of blooming) which prominently degrades the quality of a displayed image.

It is accordingly the object of this invention to provide a charge transfer type area image sensor whose image-resolving power is improved by elevating the integration degree of picture elements and which minimizes the occurrence of blooming resulting from excess charges produced in the semiconductor substrate.

SUMMARY OF THE INVENTION

To attain the above-mentioned object, this invention provides a charge transfer type area image sensor which comprises: a photosensitive section which is constructed by arranging a plurality of photosensitive picture elements for storing a signal charge generated in accordance with the intensity of an incoming light on a semiconductor substrate of a first conductivity type in the direction of the column and the direction of the row to make a two-dimensional form; a plurality of columnar shift registers which include charge transfer channels disposed in parallel with the columnar groups of the photosensitive picture elements of the photosensitive section and a plurality of charge transfer electrodes mounted on the charge transfer channels with an insulation layer interposed therebetween, thereby transferring a charge in a prescribed direction; first means for sequentially selecting the row groups of the photosensitive picture elements of the photosensitive section in response to a first selection signal, transmitting the signal charges stored in the selected row group of the picture elements to the corresponding columnar shift register and further conducting the transmitted signal charge in the prescribed direction; second means disposed adjacent to the last charge transfer electrode of the respective columnar groups of shift registers and provided with charge storage means for temporarily storing the signal charge transmitted by the first means; third means for selecting at least once all the row groups of photosensitive picture elements in response to a second selection signal during a period extending from a point of time at which the first means selects a prescribed row group of photosensitive picture elements to a point of time at which the first means selects a succeeding row group of photosensitive picture elements, transmitting excess charges stored in the respective picture elements to the corresponding columnar groups of shift registers, and conducting the transmitted excess charges in the prescribed direction; fourth means which comprises a control electrode positioned adjacent to the last charge transfer electrode of the respective columnar groups of shift registers and a drain region disposed adjacent to the control electrode, and which discharges the excess charge transmitted by the third means to the drain region by controlling the level of a voltage impressed on the control electrode; and a row-directed register for converting signal charges of the respective row groups of photosensitive picture elements temporarily stored by the second means into series signal charges and sending forth the series signal charges in the order of the row groups of photosensitive picture elements.

With a charge transfer type area image sensor embodying this invention, drive voltages or pulse trains respectively including pulses having voltage levels V1, V2, V3, V4 are impressed on the charge transfer electrodes corresponding to the respective photosensitive picture elements. Where the semiconductor substrate is of the p conductivity type, the above mentioned voltage levels retain the following relationship:

$$V1 < V2 < V3 < V4$$

A signal charge stored in a photosensitive picture element corresponding to the signal charge transfer electrode on which a pulse having a voltage level of V4 is impressed is transmitted to the charge transfer channel of the corresponding columnar group of shift registers. An excess charge stored in a photosensitive picture element corresponding to the charge transfer electrode on which a pulse having a voltage level of V3 is impressed is transmitted to the charge transfer channel of the corresponding columnar group of shift registers. Each time a charge transfer electrode is impressed with a pulse having a voltage level of V2, a signal charge and excess charge transmitted to the charge transfer channel are transferred to the prescribed side of the columnar groups of shift registers. In this case, mixture tends to arise between signal charges and excess charges in the process of being transmitted. To suppress this mixture, the voltage level on the charge transfer electrode is so controlled by a pulse having a voltage level of V1 as to cause a potential barrier to be produced between a potential well for effecting the transfer of the signal charge and a potential well for carrying out the transfer of the excess charge. Where an excess charge is conducted to an area lying below the last charge transfer electrode of the respective columnar groups of shift registers, then the gate of the control electrode of the fourth means is opened to drain off the excess charge to the drain. Except when the excess charge is expelled, the gate of the control electrode remains closed, thereby causing a signal charge to be temporarily stored in an area defined below the storage electrode of the second means. The temporarily stored signal charge is sent forth from the output terminal of the row-directed shift register for each row group of photosensitive picture elements.

With a charge transfer type area image sensor embodying this invention, a plurality of columnar groups of shift registers have only to be arranged in parallel with the columnar groups of photosensitive picture elements, making it unnecessary to provide an overflow control electrode 8a and overflow drain 9a, as shown in FIG. 1 indicating the arrangement of the prior art area image sensor, for example, for the columnar group of photosensitive picture elements 2a to 2d. This arrangement elevates the integration density of photosensitive picture elements and improves the quality of a displayed picture. Further, excess charges generated in the respective photosensitive picture elements are drained off through a control gate, when transmitted to the last charge transfer electrode of the respective columnar groups of shift registers, thereby suppressing the occurrence of blooming which might otherwise arise from the excess charges. Like these excess charges, those portions of the charges generated in the semiconductor substrate which leak to the potential well for effecting the transfer of excess charges produced in the columnar groups of charge transfer channels are drained off when conducted to an area defined below the last charge transfer electrode of the respective columnar groups of shift registers, thereby reducing the occurrence of the aforementioned smears. In contrast, with the conventional area image sensor arranged in FIG. 1, the above-mentioned leak current will always be transmitted to the row groups shift registers.

BRIEF DESCRIPTION OF THE DRAWINGS

This invention can be more fully understood from the following detailed description when taken in conjunction with the accompanying drawings, in which:

FIGS. 4A to 4P are timing charts illustrating the operation of the area image sensor of this invention, also showing the relationship between the shapes of potential wells formed in the areas defined below the electrodes indicated in FIG. 2B and the charges;

FIGS. 5A to 5E are timing charts illustrating the operation of the area image sensor of the invention, also showing the relationship between the shapes of potential wells formed in the areas defined below the electrodes indicated in FIG. 2C and the charges;

FIGS. 6A and 6B are timing charts illustrating the operation of the area image sensor of the invention, also showing the relationship between the shapes of potential wells formed in the area defined below the electrode indicated in FIG. 2E;

DESCRIPTION OF THE PREFERRED EMBODIMENT

Figure 2A:
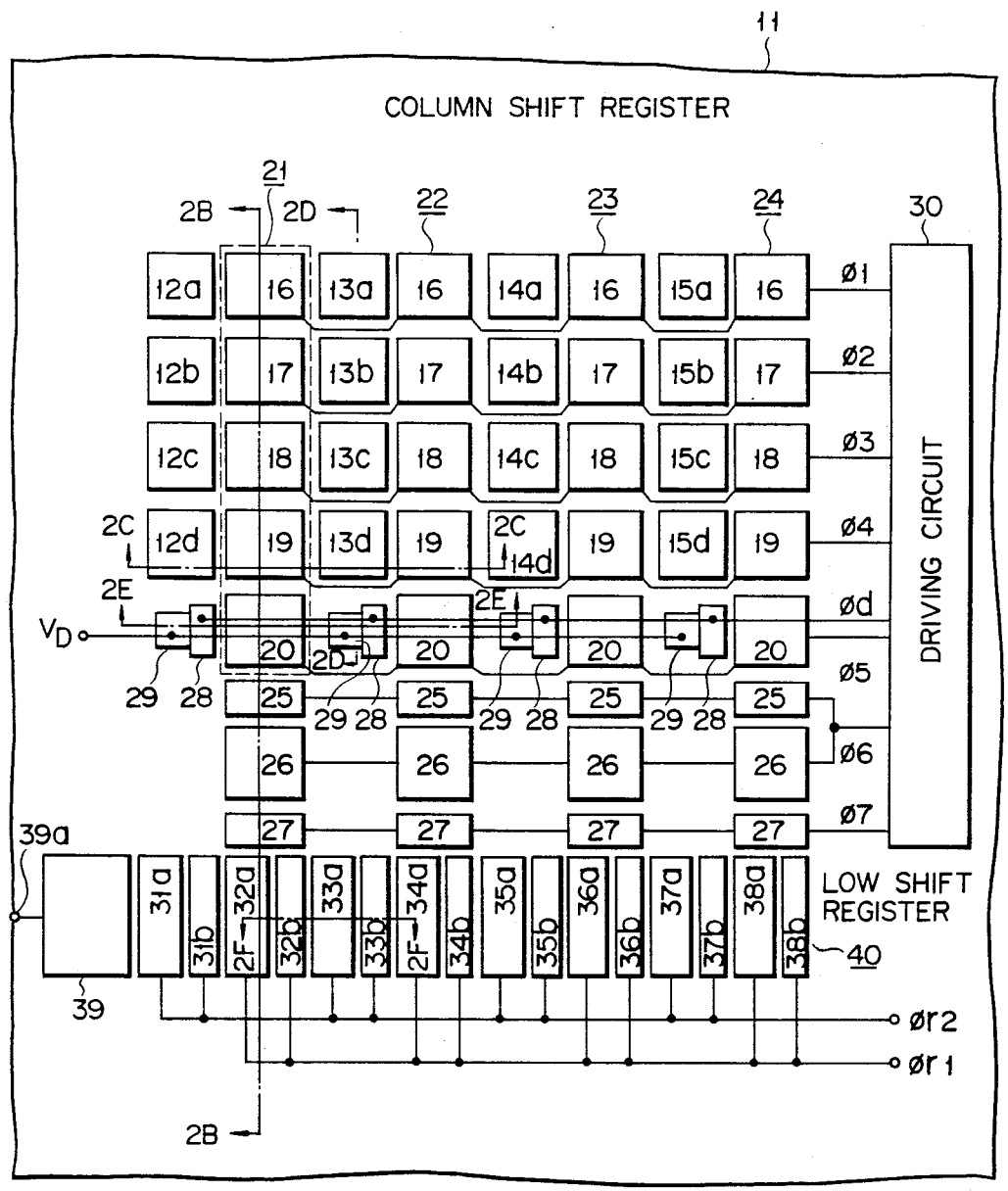
FIG. 2A is a plan view of a charge transfer type area image sensor of the interline system embodying this invention.

Referring to FIG. 2A, reference numerals 12a to 12d, 13a to 13d, 14a to 14d, 15a to 15d denote the first, second, third and fourth columnar groups of n-type semiconductor island regions formed on a semiconductor substrate 11. These island regions, together with the semiconductor substrate 11, constitute photodiodes acting as photosensitive elements or picture elements. Four columnar groups of shift registers 21, 22, 23, 24 are arranged closely in parallel with the first to the fourth columnar groups of photosensitive picture elements. Each of the four columnar groups of shift registers 21, 22, 23, 24 comprises an n-type charge transfer channel 41 (FIG. 2B) embedded in the semiconductor substrate 11 and a plurality of charge transfer electrodes 16, 17, 18, 19 mounted on the charge transfer channel 41 with an insulation layer 45 interposed therebetween. The charge transfer electrodes 16, 17, 18, 19 correspond to the related photosensitive picture elements. However, the charge transfer electrode 20 does not directly correspond to any photosensitive picture element. For convenience of description, reference numerals 12d, 13d, 14d, 15d are taken to denote a first row group of photosensitive elements. Reference numerals 12c, 13c, 14c, 15c are taken to represent a second row group of photosensitive elements. Reference numerals 12b, 13b, 14b, 15b are supposed to show a third row group of photosensitive elements. Reference numerals 12a, 13a, 14a, 15a are assumed to indicate a fourth row group of photosensitive elements. Obviously, the charge transfer channels 41 of the respective columnar groups of shift registers extend to the later described row-directed shift register 40. As viewed in the direction of the column, storage electrodes 25, 26 and bottom gate 27 are made to follow the last charge transfer electrode 20 of the respective columnar groups of shift registers in the order mentioned. The row-directed shift register 40 intersects the respective columnar groups of shift registers and is set adjacent to four bottom gates 27. The row-directed shift register 40 comprises signal charge transfer electrodes 31a, 31b, 32a, 32b, 33a, 33b, 34a, 34b, 35a, 35b, 36a, 36b, 37a, 37b, 38a, 38b arranged in the order mentioned as counted from the left side of FIG. 2A. Reference numeral 39a is an output terminal and reference numeral 39 is an output stage of the shift register 40. A control gate 28 is provided adjacent to the last charge transfer electrode 20 of the respective columnar groups 21, 22, 23, 24 of shift registers. As shown in FIG. 2E, n+ semiconductor island regions 29, namely, drains are formed on the semiconductor substrate 11 adjacent to the corresponding control gates 28.

The subject area image sensor further comprises a drive circuit 30 for issuing drive pulse trains $\phi 1$ to $\phi 7$ and $\phi d$. The pulse train $\phi 1$ is supplied to the charge transfer electrode groups 16 corresponding to the fourth row group of photosensitive picture elements. The pulse train $\phi 2$ is conducted to the charge transfer electrodes 17 corresponding to the third row group of photosensitive picture elements. The pulse train $\phi 3$ is delivered to the charge transfer electrodes 18 corresponding to the second row group of photosensitive picture elements. The pulse train $\phi 4$ is supplied to the charge transfer electrodes 19 corresponding to the first row group of photosensitive picture elements. The pulse train $\phi 5$ is delivered to the last charge transfer electrode 20 of the respective columnar groups of photosensitive picture elements. The pulse train $\phi 6$ is sent to the storage electrode groups 25, 26. The pulse train $\phi 7$ is carried to the bottom gate group 27. The pulse train $\phi d$ is supplied to the control gate group 28. Further, positive high voltage $V_D$ is impressed on the drain group 29. A clock pulse $\phi r1$ is supplied to the signal charge transfer electrodes 32a, 32b, 34a, 34b, 36a, 36b, 38a, 38b of the row-directed shift register 40. A clock pulse $\phi r2$ is impressed on the signal charge transfer electrodes 31a, 31b, 33a, 33b, 35a, 35b, 37a, 37b of the row-directed shift register 40.

Figure 2B:
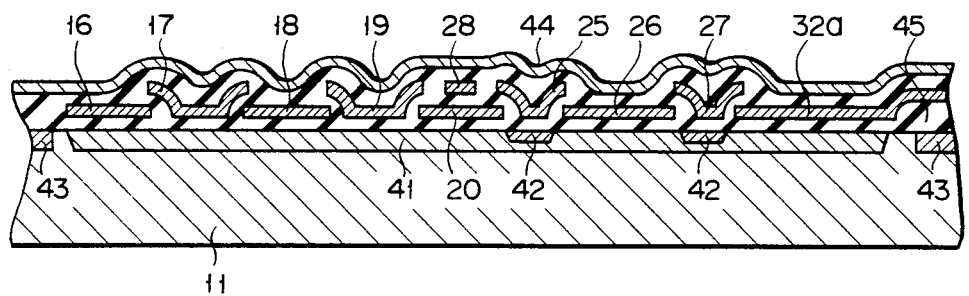
FIG. 2B is a cross sectional view on line 2B—2B of FIG. 2A.
Figure 2C:
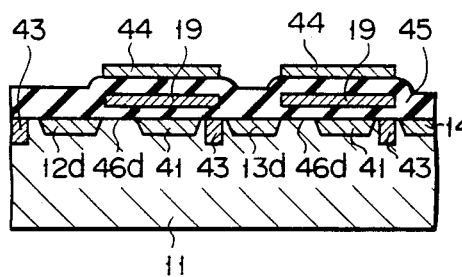
FIG. 2C is a cross sectional view on line 2C—2C of FIG. 2A.
Figure 2D:
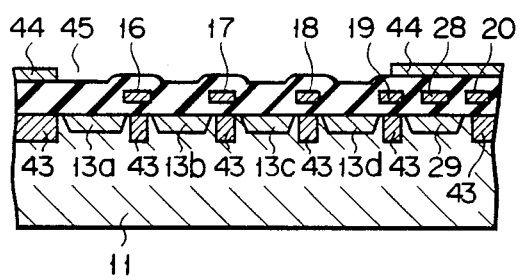
FIG. 2D is a cross sectional view on line 2D—2D of FIG. 2A.
Figure 2E:
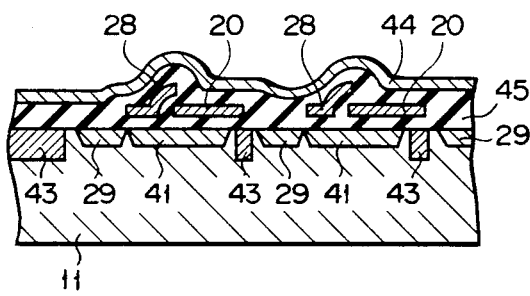
FIG. 2E is a cross sectional view on line 2E—2E of FIG. 2A.
Figure 2F:
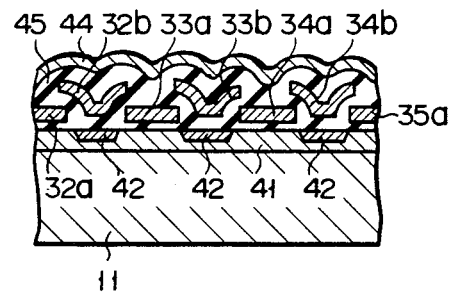
FIG. 2F is a cross sectional view on line 2F—2F of FIG. 2A.

Description is now given with reference to FIGS. 2B to 2F of the relationship between the semiconductor regions and electrode groups including charge transfer electrodes which are formed on the semiconductor substrate 11. Referring to FIG. 2B, n-type semiconductor regions 41 (hereinafter referred to as "charge transfer channels") for providing charge transfer channels for the columnar groups 21 to 24 of shift registers are formed on the surface of the semiconductor substrate 11 in a state extending to the signal charge transfer channel of the row-directed shift register 40. Mounted on the n-type charge transfer channel 41 are charge transfer electrodes 16, 17, 18, 19, the last charge transfer electrode 20 of the respective columnar groups of shift registers, storage electrodes 25, 26, bottom gate 27 and the signal charge transfer electrode 32a of the row-directed shift register 40 in the order mentioned as counted from the left side of FIG. 2B, with an insulation layer 45 interposed between the n-type semiconductor region 41 and all the above-mentioned electrodes. A p-type semiconductor island region 42 is formed on those portions of the surface of the n-type charge transfer channel 41 which face the storage electrode 25 and bottom gate 27 in order to act as a potential barrier for defining the direction in which the charge is transferred, that is, for preventing the backward flow of the signal charge. A control electrode 28 is mounted on the charge transfer electrode 20 with an insulation layer 45 interposed therebetween. Reference numeral 43 of FIG. 2B is a p-type channel stop region. An optical shield 44 is formed on the respective electrodes with an insulation layer interposed therebetween.

As shown in FIG. 2C, the portion 46d of the surface of the semiconductor substrate 11 is brought into contact with the insulation layer 45 between an n-type region constituting a picture element 12d and an n-type charge transfer channel 41 of the columnar group 21 of shift registers. A charge transfer electrode 19 is formed above the surface portion 46d of the semiconductor substrate 11 and charge transfer channel 41 with the insulation layer 45 interposed therebetween. A potential barrier formed on the surface portion 46d of the semiconductor substrate 11 has its height controlled in accordance with the level of voltage impressed on the charge transfer electrode 19. An surface portion 46d is also formed between the picture element 13d and the charge transfer channel 41 of the columnar group 22 of shift registers. The above-mentioned description also applies to the other picture elements, though not shown.

FIG. 2E indicates the relative positions of the n-type charge transfer channel 41, drain 29, control gate 28 and charge transfer electrode 20 of the columnar groups 21, 22 of shift registers. The elements 41, 29, 28, 20 of the other columnar groups 23, 24 of shift registers have the same relative positions. The parts of FIGS. 2D and 2F the same as those of FIGS. 2B, 2C, 2E are denoted by the same numerals, description thereof being omitted.

Figure 3:
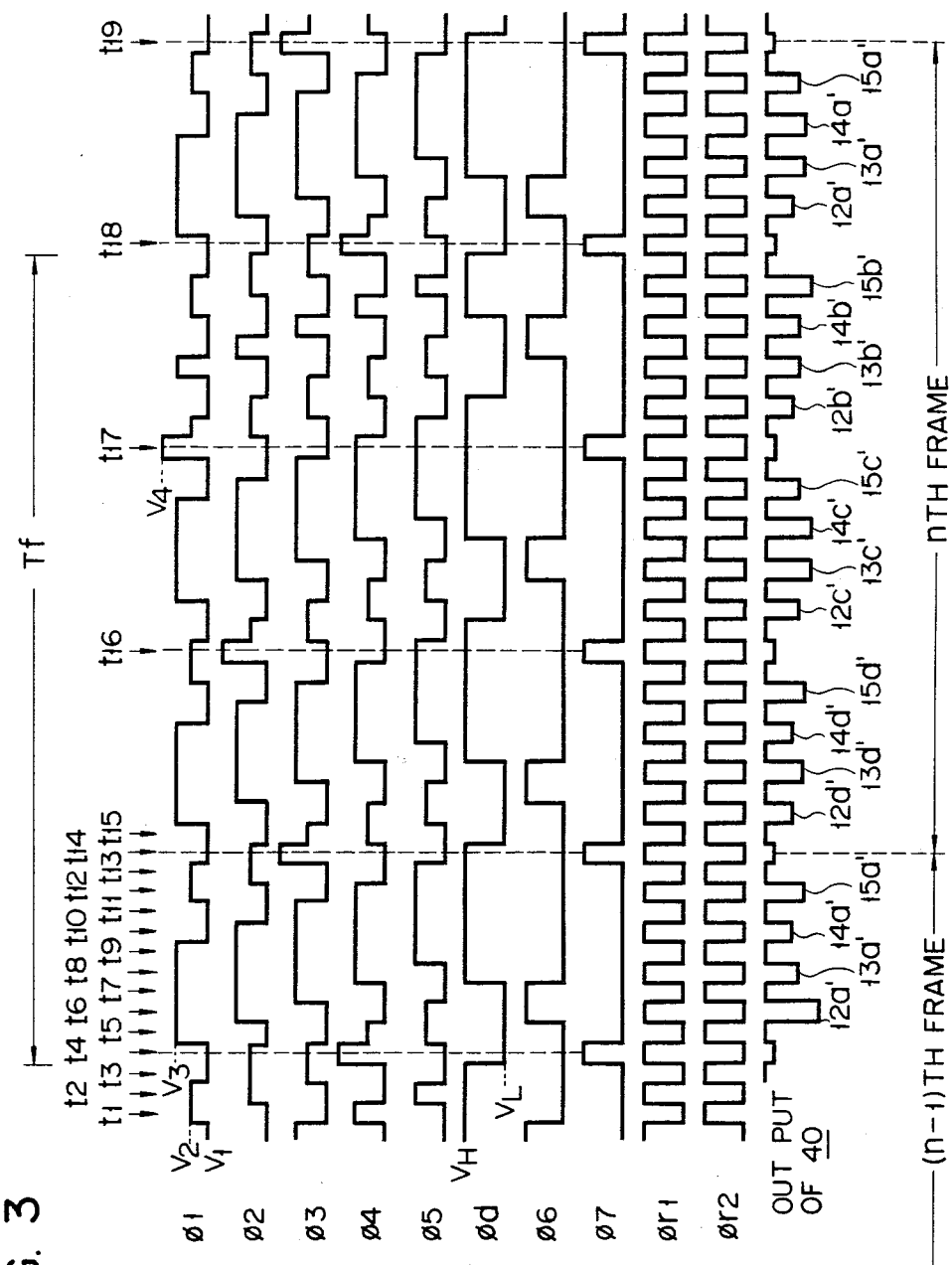
FIG. 3 is a timing chart showing the waveforms of pulse trains for driving the area image sensor of FIG. 2A.

FIG. 3 is a timing chart showing the waveforms of pulse trains $\phi1$ to $\phi7$ and $\phi d$ issued from the drive circuit 30 of FIG. 2A and clock pulses $\phi r1$, $\phi r2$ applied to the row-directed shift register 40 and an output signal of the row-directed shift register 40. The pulse trains $\phi1$ to $\phi4$ respectively have voltage levels V1 (used as the reference), V2, V3, V4. These voltage levels have the following relationship:

$$V1 < V2 < V3 < V4$$

In case where the semiconductor substrate 11 has a conductivity type n, then the above-mentioned voltage levels have the following relationship:

$$V1 > V2 > V3 > V4$$

With this invention, a pulse having a voltage level of V4 is referred to as a first selection signal. A pulse having a voltage level of V3 is referred to as a second selection signal. A pulse having a voltage level of V2 is assumed to be used for transmission of a charge. The pulse train $\phi5$ has voltage levels V3, V2. Pulse trains $\phi d$, $\phi6$, $\phi7$, clock pulses $\phi r1$, $\phi r2$ respectively have high and low voltage levels $V_H$, $V_L$. Where a voltage having a level of V4 is impressed on the charge transfer electrodes 16 to 19, then signal charges stored in the corresponding picture elements are transmitted to the charge transfer channel 41 of the columnar groups of shift registers. Where a voltage having a level of V3 is impressed on the charge transfer electrodes 16 to 19, then excess charges stored in the corresponding picture elements are transmitted to the charge transfer channel 41. Where a voltage having a level of V2 is impressed on the charge transfer electrodes 16 to 19, then signal charges and excess charges transmitted to the charge transfer channel 41 are transmitted by potential wells having different potential. The timings in which pulse trains $\phi5$, $\phi d$, $\phi6$ reach the prescribed voltage levels are so defined that excess charges are drawn off to the drain 29, and a signal charge received is temporarily stored under the storage electrodes 25, 26. The voltage level of the pulse train $\phi7$ is so determined as to simultaneously transmit a signal charge temporarily stored in the storage electrodes 25, 26 which corresponds to any row group of photosensitive picture elements to the row-directed shift register 40.

FIGS. 4A to 4P indicate the relationship between potential wells formed in the respective regions extending from the columnar group of shift registers 21 to the row-directed shift register 40 and the corresponding charges. FIGS. 5A to 5E indicate the relationship between a charge stored in the picture element 12d of FIG. 2C and a charge stored in a potential well formed below the charge transfer electrode 19, and also the relationship between the charge and the height of the potential barrier formed at the surface portion 46d of the semiconductor substrate. FIGS. 6A and 6B indicate the manner in which excess charges are expelled to the drain 29 shown in FIG. 2E.

Description is now given of a charge transfer type area image sensor of FIG. 2A embodying this invention with reference to FIGS. 3, 4A to 4P, 5A to 5E and 6A, 6B. Now let it be assumed that at a point of time t1 of FIG. 3, a signal charge Q14 generated in the photosensitive picture element 12a of the fourth row of the first column is stored in a potential well formed below the storage electrode 26 during an (n−1)th frame preceding a nth frame by one frame Tf. At a point of time t1, a pulse train $\phi4$ supplied to the charge transfer electrode 19 of the shift register 21 which faces the picture element 12d of the first row of the first column has the same voltage level as the voltage level V3 of the second selection signal. Therefore, a potential barrier formed on the surface of the surface portion 46d (FIG. 2C) of the semiconductor substrate 11 which faces the picture element 12d has a potential barrier of V3' (FIG. 5D). Where an excess charge Qe is generated in the picture element 12d receiving an extremely luminous light, then the excess charge Qe runs over the potential barrier V3' into a potential well formed below the charge transfer electrode 19 (FIG. 5D). FIG. 4A indicates the excess charge Qe running into a potential well formed below the charge transfer electrode 19.

At a point of time t2, a pulse train $\phi5$ supplied to the charge transfer electrode 20 has the same voltage level as the voltage level V3 of the second selection signal and a pulse train $\phi d$ delivered to the control gate 28 has a high voltage level $V_H$. Therefore, the charge transfer electrode 20 and a potential well formed below the control gate 28 have a voltage level indicated in FIG. 6A, causing the excess charge Qe produced in the picture element 12d to run below the control gate 28 and be drawn off to the drain 29.

At a point of time t3, pulses trains $\phi1$, $\phi4$ have a low voltage level of V1 alike. Consequently, potential barriers formed on the surfaces of the surface portions 46a, 46d which respectively face the picture elements 12a, 12d have a high potential barrier V1' (FIG. 5A), causing a signal charge Q11 to be stored in the picture element 12d of the first row of the first column (FIG. 5A). At a point of time t3, a pulse train $\phi7$ supplied to the bottom gate 27 still stands at a low voltage level $V_L$, causing a signal charge Q14 shown in FIG. 4A to remain stored in a potential well formed below the storage electrode 26 (FIG. 4C).

At a point of time t4, a pulse train $\phi4$ supplied to the charge transfer electrode 19 has the same voltage level as the voltage level V4 of the first selection signal. Therefore, the signal charge Q11 (FIG. 5A) stored in the picture element 12d of the first row of the first column is transmitted to the charge transfer channel 41 of the columnar group 21 of shift registers, namely, to a potential well formed below the charge transfer electrode 19 (FIG. 5B). A charge Qr shown in FIG. 5C is a residual charge remaining in the picture element 12d after the transmission of the signal charge Q11. At the point of time t4, since a pulse train $\phi7$ has a high voltage level $V_H$, the bottom gate 27 is opened, and a signal charge Q14 (FIGS. 4A, 4B, 4C) previously generated in the picture element 12a of the fourth row of the first column during the (n−1)th frame preceding the nth frame by one frame Tf passes below the bottom gate 27 and is transmitted to a potential well formed below the signal charge transfer electrode 32a of the row-directed shift register 40 (FIG. 4D). At the point of time t4, signal charges stored in the picture elements 13d, 14d, 15d of the first row of the second to the fourth columns (not shown) are transmitted to the potential wells of the charge transfer electrodes 19 of the corresponding columnar groups 22 to 24 of shift registers. Signal charges previously generated in the picture elements 13a, 14a, 15a of the fourth row of the second to the fourth columnar groups of shift registers are transmitted to the potential wells formed below the signal charge transfer electrodes 34a, 36a, 38a of the row-directed shift register 40.

Therefore, successively sent forth from the output stage 39 of the row-directed shift register 40 are four charge signals 12a', 13a', 14a', 15a' transmitted from the picture elements 12a, 13a, 14a, 15a of the fourth row of the respective columnar groups of shift registers and stored under the storage electrodes 25, 26 during the previous frame, in synchronization with the clock pulses $\phi$rl, $\phi$r2.

At a point of time t5, pulse trains $\phi$4, $\phi$5 supplied to the charge transfer electrodes 19, 20 have the same voltage level alike as the level V2 of a charge transfer voltage. At this time, a potential barrier formed on the surface portion 46d (FIG. 2C) of the semiconductor substrate 11 which faces the picture element 12d of the first row of the first columnar group 21 of shift registers has a high voltage level V2' (FIG. 5C). Since, at this time, a pulse train $\phi$d has a low voltage level $V_L$, the control gate 28 remains closed. Therefore, a signal charge Q11 generated in the picture element 12d is stored in a potential well formed in an area extending over the underside of the charge transfer electrodes 19, 20 of the first columnar group 21 of shift registers (FIG. 4E). At the point of time t5, a pulse train $\phi$1 conducted to the charge transfer electrode 16 has the same voltage level as the voltage level V3 of the second selection signal. Therefore, an excess charge Qe generated in the picture element 12a is transmitted to a potential well formed below the charge transfer electrode 16 (FIG. 4E).

At a point of time t6, a pulse train $\phi$6 supplied to the storage electrodes 25, 26 has a high voltage level $V_H$. Therefore, a signal charge Q11 (FIG. 4E) generated in the picture element 12d and later stored in a potential well formed in an area extending over the underside of two charge transfer electrodes 19, 20 is transmitted to a potential well formed below the storage electrodes 26, 27 (FIG. 4F). At the point of time t6, a pulse train $\phi$2 delivered to the charge transfer electrode 17, and a pulse train $\phi$1 have the same voltage level alike as the voltage level V3 of the second selection signal. Therefore, an excess charges Qe generated in the picture elements 12a, 12b are respectively transmitted to potential wells formed below the corresponding charge transfer electrodes 16, 17 (FIG. 4F).

Between time points t7 and t13, as shown in FIG. 3, pulse trains $\phi$1 to $\phi$5 are successively made to have the same voltage level as the voltage level V3 of the second selection signal. Therefore, excess charges Qe generated in the picture elements 12a to 12d of the first columnar group are transmitted to the charge transfer channel 41 of the first columnar group 21 of shift registers and then to a potential well formed below the charge transfer electrode 20. During a period which extends from a point of time t5 to a point of time t13, a charge generated in the semiconductor substrate 11 is conducted to the charge transfer channel 41. Actually, therefore, the above-mentioned excess charges Qe transmitted to the potential well formed below the charge transfer electrode 20 have a magnitude equal to a sum of the signal charges generated in the aforementioned picture elements 12a to 12d of the first columnar group and a charge produced in the semiconductor substrate 11.

At a point of time t14, a pulse train $\phi$3 supplied to the charge transfer electrode 18 has the same voltage level as the voltage level V4 of the first selection signal. Therefore, the signal charges stored in the picture elements 12c, 13c, 14c, 15c of the second row of the first to the fourth columnar groups are respectively transferred to the potential wells formed below the charge transfer electrodes of the corresponding columnar groups 21, 22, 23, 24 of shift registers. FIG. 4N indicates a signal charge Q12 which was stored in the picture element 12c of the second row of the first column and then transmitted to a potential well formed below the charge transfer electrode 18. At the point of time t14, a pulse train $\phi$7 supplied to the bottom gate 27 has a high voltage level $V_H$, causing the bottom gate 27 to remain open. Therefore, a signal charge Q11 (FIG. 4M) stored in the picture element 12d of the first row of the first column is conducted below the bottom gate 27 to a potential well formed below the signal charge transfer electrode 32a of the row-directed shift register 40 (FIG. 4N). Further at the point of time t14, the signal charges which were generated in the picture elements 13d, 14d, 15d of the first row of the second to the fourth columnar groups and then transmitted to the storage electrodes 26 of the columnar groups of picture elements are simultaneously delivered to the row-directed shift register 40. At points of time after the point of time t14, four signal charges 12d', 13d', 14d', 15d' stored in the picture elements 12d, 13d, 14d, 15d of the first row of the first to the fourth columnar groups are sent forth from the row-directed shift register 40 in synchronization with clock pulses $\phi$rl, $\phi$r2. During a period which extends from the point of time t8 to the point of time t14, a pulse train $\phi$d supplied to the control gates 28 of the respective columnar groups of picture elements has a high voltage level $V_H$, causing the control gates 28 to remain open. During a period which extends from a point of time t8 to a point of time t14, an excess charge Qe is conducted below the control gates 28 to the drains 29 (FIG. 6A).

At a point of time t15, pulse trains $\phi$3, $\phi$4 supplied to the charge transfer electrodes 18, 19 have the same voltage level as the charge transfer voltage V2. At the point of time t15, a signal charge Q12 generated in the picture element 12c is transmitted to a potential well formed in an area extending over the underside of two charge transfer electrodes 18, 19 (FIG. 4P). This signal charge Q12 is temporarily stored in a potential well formed below the storage electrode 26. While the signal charge Q12 is kept stored in a potential well formed below the storage electrode 26, the excess charges Qe generated in the picture elements are successively conducted below the charge transfer electrodes 16 to 20 to the drains 29. During a period extending from a point of time t16 to a point of time t17, signal charges stored in the picture elements 12c, 13c, 14c, 15c of the second row of the first to the fourth columnar groups are transmitted to the row-directed shift register 40, which sends forth signal charges 12c', 13c', 14c', 15c' in succession. During a period extending from a point of time t17 to a point of time t18, signal charges stored in the picture elements 12b, 13b, 14b, 15b of the third row of the first to the fourth columnar groups are transmitted to the row-directed shift register 40. During a period extending from a point of time t18 to a point of time t19, signal charges stored in the picture elements 12a, 13a, 14a, 15a of the fourth row of the first to the fourth columnar groups are also transmitted to the row-directed shift register 40. As a result, signal charges 12b', 13b', 14b', 15b', 12a', 13a', 14a', 15a' are successively sent forth from the output stage 39 of the subject area image sensor in synchronization with clock pulses $\phi$rl, $\phi$r2.

The characteristics of this invention will become apparent from the foregoing description. Reference is now made to, for example, a picture element 12d. When control is made of the height of a potential barrier formed on the surface portion 46d of the semiconductor substrate 11 which is defined between the picture element 12d and the charge transfer channel 41 of the first columnar group 21 of shift registers (FIG. 2C), then a signal charge and excess charge generated in the picture element 12d are separately transmitted to the corresponding columnar group 21 of the shift registers. Both signal charge and excess charge are separately conducted along the charge transfer channel 41. The signal charge is temporarily stored in a potential well formed below the storage electrode 26. On the other hand, the excess charge is expelled to the drain 29 through the control gate 28. To describe in greater detail, where the charge transfer electrode 19 corresponding to the picture element 12d is supplied with a pulse train $\phi 4$ having a voltage level of V4 as a first selection signal, then a potential barrier formed on the surface portion 46d of the semiconductor substrate 11 has its height reduced to a level of V4', causing a signal charge Q11 to be transmitted to the charge transfer channel 41 (FIG. 5B). During the greater part of a period in which a signal charge is stored in the picture element 12d, a pulse train $\phi 4$ supplied to the corresponding signal transfer electrode 19 has the same voltage level as the voltage level V3 of the second selection signal. Therefore, the potential barrier formed on the surface portion 46d of the semiconductor substrate 11 assumes a level of V3' higher than V4' (FIG. 5D). Consequently, a signal charge can be stored in the picture element 12d, until the potential barrier assumes a height of V3'. A charge generated in the picture element 12d with a higher potential level than V3' is transmitted as an excess charge Qe to the charge transfer channel 41 (FIG. 5D). Where the signal charge and excess charge Qe are separately conducted by potential wells having different potential levels, then it is necessary to prevent the excess charge Qe from entering that potential well by which the signal charge is transmitted. To meet this requirement, an area image sensor embodying this invention is so arranged that a pulse train $\phi 4$ is issued with a voltage level of V2 for a prescribed period in order to enable a charge transfer electrode to be impressed with a voltage V1 lower than the aforementioned voltage level of V2, thereby forming a potential barrier between a potential well by which a signal charge is transmitted and a potential well by which an excess charge is conducted. For better understanding of this invention, reference was made particularly to the picture element 12d. Obviously, the foregoing description also applies to any other picture elements. As seen from the foregoing description, a maximum charge quantity $Q_M$ which can be stored in each picture element is expressed as $C \cdot (V4'-V3')$. A saturated luminosity $I_M$ of a light projected on each picture element is indicated as $Q_M/K \cdot Tf$ (where C denotes a static capacity prevailing between the semiconductor substrate 11 and n-type semiconductor island regions 12a to 12d, 13a to 13d, 14a to 14d, 15a to 15d; Tf represents one frame period (FIG. 3); and K is a constant of light-signal conversion occurring in a picture element). Where the quantity of a signal charge generated in a picture element during a period Tr in which pulse trains $\phi 1$ to $\phi 4$ retain a voltage level V2 (that is, the one period of clock pulses $\phi r1$, $\phi r2$) exceeds a level of $C \cdot (V3'-V2')$, then the excess charge runs into a potential well by which the signal charge is transmitted, undesirably resulting in the occurrence of a sort of blooming. A maximum luminosity $I_{BM}$ of a light projected on a picture element is set at $C \cdot (V3'-V2')/2K \cdot Tr$ in order to suppress the occurrence of blooming. Assuming $V3'-V2'=V4'-V3'$, and $Tf=20Tr$, there results $I_{BM}=10I_M$. In other words, even where a maximum luminosity $I_{BM}$ of a light projecting on a picture element is 10 times higher than the saturated light luminosity $I_M$, the area image sensor of this invention can suppress the occurrence of smearing.

Figure 1:
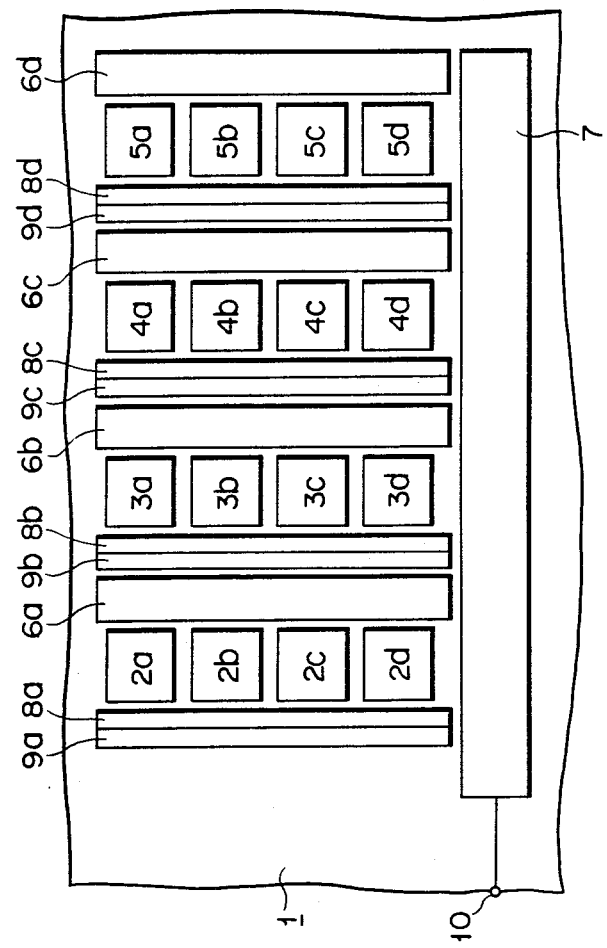
FIG. 1 is a plan view of the conventional charge transfer type area image sensor of the interline system.

Detailed description is now given of the advantages of the area image sensor of FIG. 2A embodying the invention over that of the prior art shown in FIG. 1. The area image sensor of this invention shown in FIG. 2A which eliminates the necessity of providing, for example, an overflow electrode 9a and overflow control electrode 8a close to the respective columnar groups of photosensitive picture elements as in the prior art image sensor of FIG. 1 can elevate the integration density of photosensitive picture elements as previously mentioned. Between chips of the same size, this invention can significantly improve the resolving capacity, and furthermore can noticeably decrease the occurrence of smearing particularly that resulting from charges generated in the semiconductor substrate, than has been possible with prior art area image sensors. The reason for this is as follows. Now let it be assumed that $Q_{SB}$ represents the total quantity of charge which is generated in the semiconductor substrate 11 and then brought into the charge transfer channels 41 of the columnar groups of shift register during one frame Tf. With the conventional area image sensor of FIG. 1, signal charges are issued 16 times during one frame Tf from the row-directed shift register 7. Therefore, a smear component included in a signal charge issued each time, that is, an average quantity of excess charges generated in the semiconductor substrate 11 is expressed as $Q_{SB}/16$. In contrast, with the area image sensor of the invention shown in FIG. 2, smear components are only composed of charges transmitted from the semiconductor substrate 11 into a potential well formed below the charge transfer electrode which transmits a signal charge when impressed with a signal transfer voltage of V2. On the other hand, charges conducted to a potential well formed below the transfer electrode which transmits a signal charge when impressed with a second selection signal having a voltage level of V3 are expelled to the drains 29, and consequently do not constitute smear components. Therefore, smear components resulting from charges generated in the semiconductor substrate 11 are measured approximately as $(Q_{SB}/16) \times (2Tr/5Tr) = Q_{SB}/40$. This means that smear components anticipated from the area image sensor of this invention are only two-fifths of the smear components experienced with the conventional area image sensor of FIG. 1.

Figure 7:
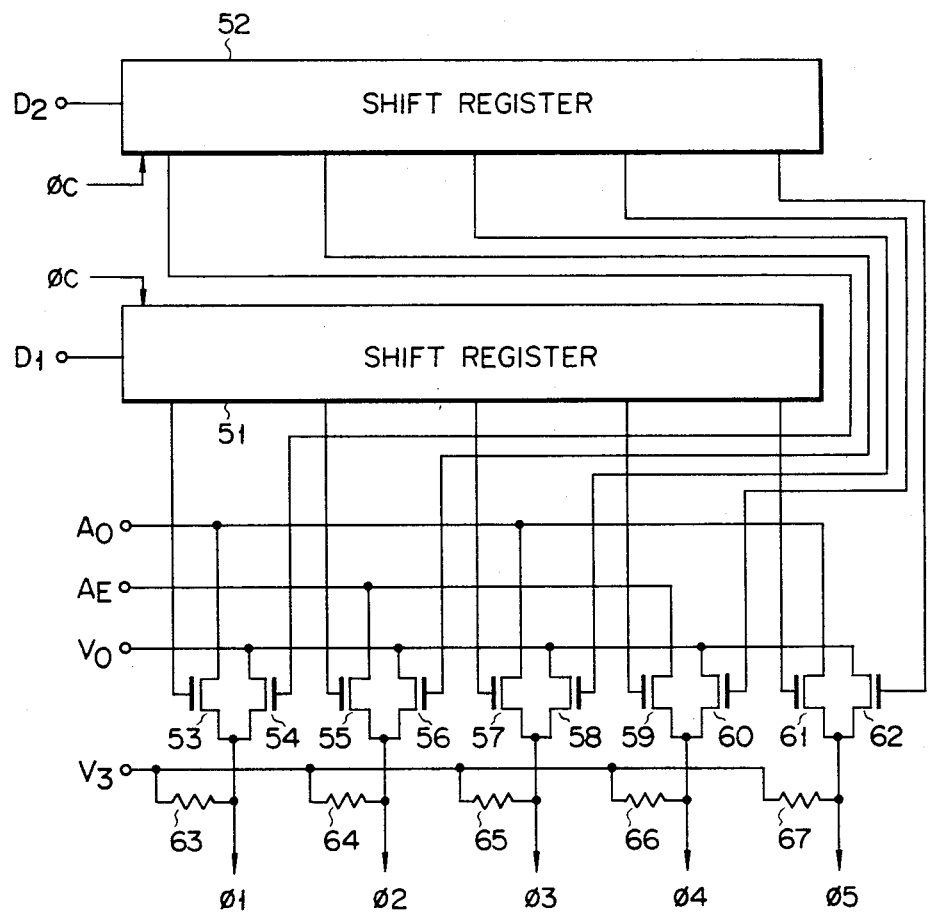
FIG. 7 is a block circuit diagram of the main part of a driving circuit used with the area image sensor of FIG. 2A.
Figure 8:
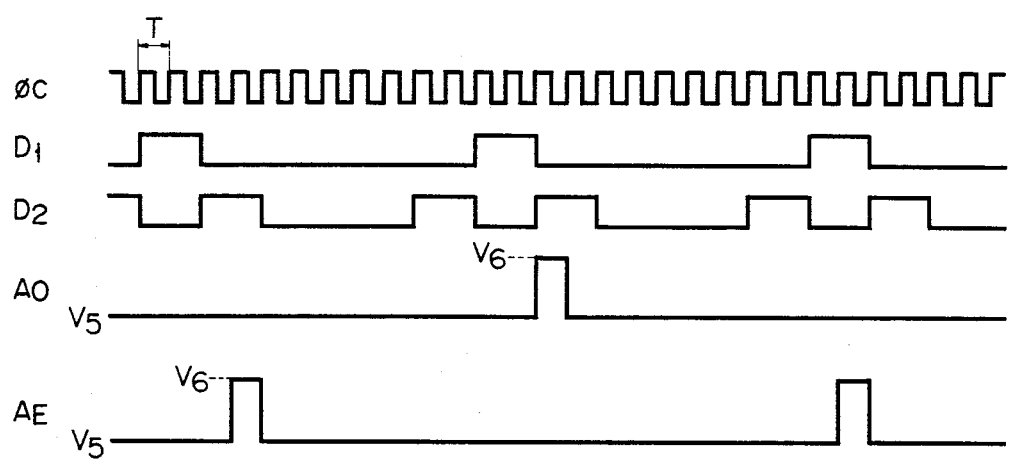
FIG. 8 is a timing chart of signals supplied to the driving circuit of FIG. 7.

FIG. 7 indicates the arrangement of that section of the drive circuit 30 of FIG. 2A which issues pulse trains $\phi 1$ to $\phi 5$. FIG. 8 is a timing chart of signals supplied to the circuit of FIG. 7. Referring to FIG. 7, reference numeral 51 denotes a shift register for successively shifting an input signal D1 in synchronization with a clock pule $\phi c$. Reference numeral 52 represents a shift register for successively shifting an input signal D2 in synchronization with the clock pulse $\phi c$. Reference numerals 53, 54 show paired MOS transistors whose sources are connected together to send forth a pulse train $\phi 1$. The drain of the MOS transistor 53 is supplied with a signal $A_O$ and the drain of the MOS transistor 54 is impressed with a reference voltage V0 (V0<V1 in FIG. 3). The gate of the MOS transistor 53 is supplied with a first output signal from the shift register 51. The gate of the MOS transistor 54 is supplied with a first output signal from the shift register 52. Groups of reference numerals 55-56, 57-58, 59-60 and 61-62 represent a plurality of pairs of MOS transistors which are connected together in a manner similar to that in which the first mentioned group of paired MOS transistors 53, 54 are coupled together. The above-mentioned groups of MOS transistors are only indicated, description thereof being omitted. Pulses trains $\phi 2$, $\phi 3$, $\phi 4$, $\phi 5$ are sent forth from the drains of the other MOS transistor pairs 55-56, 57-58, 59-60 and 61-62. An input signal $A_O$ has a voltage level V5 (V5<V2 in FIG. 3). An input signal $A_E$ has a voltage level V6 (V6>V4 in FIG. 3). The high voltage level of a signal D1 and the low voltage level of a signal D2 are changed in the timing indicated in FIG. 8. The sources of the respective MOS transistor pairs are impressed with the voltage level of V3 of the second selection signal through the corresponding resistors 63, 64, 65, 66, 67. Referring to FIG. 7, an input signal D1 to the shift register 51 is successively shifted for each period T of a clock pulse $\phi c$, thereby rendering MOS transistors 53, 55, 57, 59, 61 conducting in turn. An input signal D2 to the shift register 52 is successively shifted for each period T of a clock pulse $\phi c$, thereby rendering MOS transistors 54, 56, 58, 60, 62 conducting in turn. Where the gates of the respective MOS transistor pairs 53-54, 55-56, 57-58, 59-60, 61-62 are supplied with a signal having a low voltage level, then output pulse trains $\phi 1$ to $\phi 5$ respectively have a voltage level of V3. Where the gates of the MOS transistors 53, 55, 57, 59, 61 included in the respective MOS transistor pairs are supplied with an input signal having a high level, and the gates of the counterpart MOS transistors 54, 56, 58, 60, 62 are supplied with an input signal having a low level, then output pulse trains $\phi 1$ to $\phi 5$ have a voltage level of V2 obtained by dividing voltage difference between the voltages of V5 and V3 by the internal resistance of the MOS transistors 53, 55, 57, 59, 61 rendered conducting and the resistors 63, 64, 65, 66, 67 corresponding to the MOS transistors 53, 55, 57, 59, 61. Where the MOS transistors 54, 56, 58, 60, 62 are rendered conducting with their gates impressed with a high level voltage, and the counterpart transistors 53, 55, 57, 59, 61 are rendered nonconducting with their gates impressed with a low level voltage, then the pulse trains $\phi 1$ to $\phi 5$ have a voltage level of V1 obtained by dividing voltage difference between the voltages of V0 and V3 by the internal resistance of the MOS transistors 54, 56, 58, 60, 62 rendered conducting and the corresponding resistors 63, 64, 65, 66, 67. Where the MOS transistors 53, 55, 57, 59, 61 are rendered conducting and the counterpart MOS transistors 54, 56, 58, 60, 62 are rendered nonconducting, and the signal $A_O$ or $A_E$ has a voltage level of V6, then the pulse trains $\phi 1$ to $\phi 4$ have a voltage level of V4. The pulse trains $\phi 1$ to $\phi 5$ of FIG. 3 have their voltage levels defined as described above.

Figure 9:
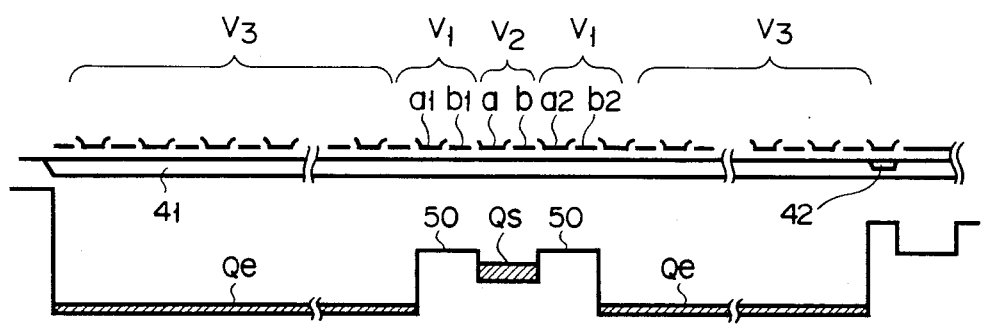
FIG. 9 sets forth the principle by which a modification of the columnar group of shift registers shown in FIG. 2A is actuated.

Description is now given of the reason why the application of the area image sensor of this invention to a solid image sensor used with the standard TV image pickup system further suppresses the occurrence of blooming. Now let it be assumed that an N number of photosensitive picture elements are arranged in the direction of the row, and an M number of photosensitive picture elements are arranged in the direction of the column; and that a signal charge Qs stored in each photosensitive element is to be transmitted. Further let it be assumed, as shown in FIG. 9, that the signal charge Qs is transmitted by a potential well formed below two charge transfer electrodes a, b; charge transfer electrodes a1, b1 set before the charge transfer electrode a, and charge transfer electrodes a2, b2 positioned after the charge transfer electrode b are respectively impressed with a low voltage V1, thereby forming potential barriers 50 on both sides of a potential well by which the signal charge Qs is transmitted; and the other charge transfer electrodes than those described above are impressed with a high voltage V3, thereby forming a potential well by which the excess charge Qe is transmitted. The previously described expression $C \cdot (V4' - V3')$ representing a maximum charge quantity $Q_M$ which can be stored in one picture element, and also the aforesaid expression $Q_M/K \cdot Tf$ denoting a saturated luminosity $I_M$ are assumed to be also applicable to the above-mentioned assumptions. Referring to FIG. 9, a maximum luminosity $I_{BM}$ of a light projected on a picture element should satisfy the following equation:

$$C \cdot (V3' - V2') = 2K \cdot Tr \cdot I_{BM}$$

in order to prevent an excess charge Qe from entering the potential well by which the signal charge Qs is transmitted. Now let it be assumed that the previously mentioned N number of photosensitive picture elements arranged in the direction of the row, and the aforesaid M number of photosensitive picture elements arranged in the direction of the column are about 500 alike. Then there approximately results the following equation:

$$Tf = M \cdot N \cdot Tr$$

Assuming $V3' - V2' = V4' - V3'$ as previously mentioned, $I_{BM}$ is expressed as $(M \cdot N \cdot I_M)/2$. Assuming $M = N = 500$, there results $$I_{BM} = 125,000 \, I_M$$

The terms $I_{BM}$ and $I_M$ have substantially the same relationship as is realized when an overflow drain 9a is provided as shown in FIG. 1. With the prior art area image sensor of FIG. 1, smear components resulting from charges generated in the semiconductor substrate 11 are expressed as $Q_{SB}/M \cdot N$ per picture element. In contrast, with the area image sensor of this invention, the smear components are far more reduced to a value approximately expressed as $2Q_{SB}/M^2N$. In other words, assuming $M = N = 500$, smear components occurring in the area image sensor of this invention are prominently reduced to 1/250 of the quantity of smear components arising in the conventional area image sensor. Therefore, the larger the number of photosensitive picture elements, the more effective the suppression of the blooming and smear is carried out by the present invention.

Figure 10:
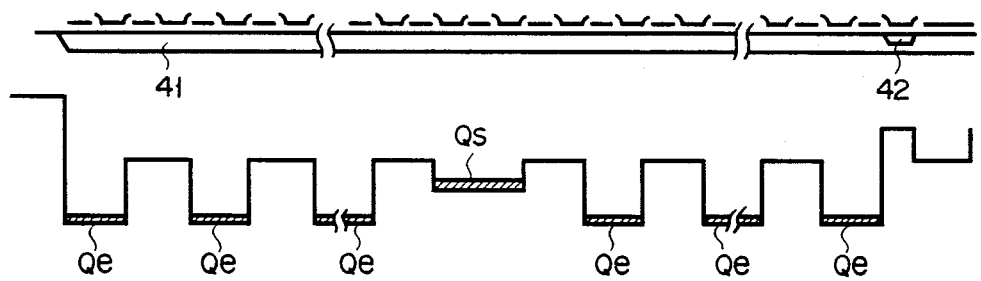
FIG. 10 indicates the principle by which another modification of the columnar group of shift registers shown in FIG. 2A is operated.

Obviously, this invention is not limited to the foregoing embodiment, but may be practised in various modifications. For instance, (1) it is possible to replace the p-type semiconductor substrate 11 by an n-type semiconductor substrate. (2) the photodiode used as a photosensitive picture element can be replaced by a picture element which comprises a transparent electrode mounted on a semiconductor substrate with an insulation layer interposed therebetween, and wherein use is made of a depletion region formed below the transparent electrode by impressing a voltage thereon or a picture element which comprises a signal charge-storing electrode positioned near a photodiode. (3) the row-directed shift register actuated by clock pulses φr1, φr2 having different phases can be replaced by a drive system of the CCD type (charge coupled device) or BBD type (bucket brigade device) actuated by clock pulses of the single, 3 or 4 phases. (4) the level of a threshold voltage of the surface portions 46a to 46d of the semiconductor substrate 11 can be controlled by diffusing an impurity in the surface portions 46a to 46d by ion implantation. (5) it is possible to mount a plurality of groups of charge electrodes 25, 26 on each of the charge transfer channels of the columnar groups 21 to 24 of shift registers and temporarily store signal charges transmitted from plural row groups of the photosensitive picture elements. (6) a charge transfer channel in which an n-type semiconductor region 41 is embedded can be replaced by a surface channel type charge transfer channel. (7) a circuit for issuing pulse trains φ1 to φ5 used with the drive circuit 30 is not limited to that which is arranged as shown in FIG. 7. Obviously the waveforms of the pulse trains φ1 to φ7 and pulse train φd can be changed. (8) the excess charge Qe can be transmitted, as shown in FIG. 10, by numerous independent potential wells formed below numerous signal transfer electrodes, instead of a common potential well, as shown in FIG. 9, formed below numerous charge transfer electrodes.

What is claimed is:

1. A charge transfer type area image sensor which comprises:
    a photosensitive section which is constructed by arranging a plurality of photosensitive picture elements for storing a signal charge generated in accordance with the intensity of an incoming light on a semiconductor substrate of a first conductivity type in the direction of the column and the direction of the row to make a two-dimensional form;
    a plurality of columnar shift registers which include charge transfer channels disposed in parallel with the columnar groups of the photosensitive picture elements of the photosensitive section and a plurality of charge transfer electrodes mounted on the charge transfer channels with an insulation layer interposed therebetween, thereby transmitting a charge in a prescribed direction;
    first means for sequentially selecting the row groups of photosensitive picture elements of the photosensitive section in response to a first selection signal, transmitting the signal charges stored in the selected row group of picture elements to the corresponding columnar shift registers and further conducting the transmitted signal charges in the prescribed direction;
    second means disposed adjacent to the last charge transfer electrode of the respective columnar groups of shift registers and provided with signal charge storage electrode means for temporarily storing the signal charge transmitted by the first means;
    third means for selecting at least once all the row groups of photosensitive picture elements in response to a second selection signal during a period extending from a point of time at which the first means selects a prescribed row group of photosensitive picture elements to a point of time at which said first means selects a succeeding row group of photosensitive picture elements, transmitting excess charges, defined as a charge amount by which the charges capable of being stored in the respective picture elements are exceeded, to the corresponding columnar groups of shift registers, and conducting the transmitted excess charges in the prescribed direction;
    fourth means which comprises a control electrode positioned adjacent to the last charge transfer electrode of the respective columnar groups of shift registers and a drain region disposed adjacent to said control electrode, and discharges the excess charge transmitted by the third means to the drain region by controlling the level of a voltage impressed on said control electrode; and
    a row-directed shift register for converting the signal charges of the respective row groups of photosensitive picture elements temporarily stored by the second means into series signal charges and sending forth the series signal charge in the order of the row groups of photosensitive picture elements;
    the charge transfer electrodes of the respective columnar groups of shift registers comprising:
    first charge transfer electrodes corresponding to the respective photosensitive picture elements and a second charge transfer electrode set in the last stage of the respective columnar groups of shift registers;
    the first charge transfer electrodes being supplied with drive pulse trains respectively having voltage levels of V1, V2, V3, V4, said voltage levels having the following relationship:

$$V1 < V2 < V3 < V4$$

when the semiconductor substrate is of the p conductivity type, and said voltage levels having the following relationship:

$$V1 > V2 > V3 > V4$$

when the semiconductor substrate is of the n conductivity type;
    said first means including means for impressing the first charge transfer electrode with a pulse having the voltage level of V4 as the first selection signal;
    said third means including means for impressing the first charge transfer electrode with a pulse having the voltage level of V3 as the second selection signal; and
    said means for transmitting a charge in the prescribed direction along the charge transfer channel including means for impressing the first charge transfer electrode with a pulse having the voltage level of V2 as a charge transfer signal.

2. The charge transfer type area image sensor according to claim 1, wherein the second charge transfer electrode is impressed with a pulse train having voltage levels V2, V3 which have a relationship $V3 > V2$ when the semiconductor substrate is of the p conductivity type, and which have a relationship $V3 < V2$ when the semiconductor substrate is of the n conductivity type; upon receipt of a pulse having a voltage level of V3, said second charge transfer electrode conducting the excess charge transmitted by the respective columnar groups of shift registers to the fourth means; and upon receipt of a pulse having a voltage level of V2, said second charge transfer electrode delivering the signal charge transmitted by the columnar groups of shift registers to the second means.

* * * * *